United States Patent
Frosien (10) Patent No.: US 7,633,074 B2
(45) Date of Patent: Dec. 15, 2009

(54) ARRANGEMENT AND METHOD FOR COMPENSATING EMITTER TIP VIBRATIONS

(75) Inventor: Jürgen Frosien, Riemering (DE)

(73) Assignee: ICT, Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 448 days.

(21) Appl. No.: 11/582,848

(22) Filed: Oct. 18, 2006

(65) Prior Publication Data

US 2007/0085035 A1 Apr. 19, 2007

(30) Foreign Application Priority Data

Oct. 19, 2005 (EP) ................... 05022818

(51) Int. Cl.
*A61N 5/00* (2006.01)
*G21G 5/00* (2006.01)

(52) U.S. Cl. .............. 250/492.23; 250/306; 250/307; 250/492.21; 250/492.2; 250/396; 250/310; 250/423 P; 250/396 R; 250/396 ML; 250/424

(58) Field of Classification Search ............. 250/306, 250/307, 492.23, 492.21, 492.2, 396, 310, 250/423 P, 396 R, 396 ML, 424

See application file for complete search history.

(56) References Cited

U.S. PATENT DOCUMENTS 5,831,379 A 11/1998 Jeong et al.
2006/0071175 A1* 4/2006 Kim et al. ............... 250/396 R

FOREIGN PATENT DOCUMENTS

| JP | 02 061951 | 1/1990 |
|---|---|---|
| JP | 07 037503 | 2/1995 |
| JP | 08 298088 | 11/1996 |
| JP | 09 082253 | 3/1997 |
| JP | 10 135114 | 5/1998 |
| JP | 2000 077000 | 3/2000 |
| JP | 2001 167688 | 6/2001 |

OTHER PUBLICATIONS

European Search Report dated Jun. 28, 2006.
EP Office Action dated Apr. 28, 2008.

* cited by examiner

*Primary Examiner*—Bernard E Souw
*Assistant Examiner*—Meenakshi S Sahu
(74) *Attorney, Agent, or Firm*—Patterson & Sheridan, LLP (57) ABSTRACT

A charged particle beam apparatus with a charged particle beam source including an emitter with an emitter tip and a supporting member for supporting the emitter is provided. Further, the apparatus includes an emitter location measuring device for repeatedly measuring the location of the emitter and a deflector system for compensating variations in the location of the emitter.

95 Claims, 9 Drawing Sheets

PRIOR ART

Fig. 9d

PRIOR ART

ARRANGEMENT AND METHOD FOR COMPENSATING EMITTER TIP VIBRATIONS

CROSS-REFERENCE TO RELATED APPLICATION

This application claims priority to European Patent Application No. 05022818.8, filed Oct. 19, 2005, which is herein incorporated by reference.

BACKGROUND OF THE INVENTION

1. Field of the Invention

Embodiments of the present invention relate to a charged particle beam apparatus and, more particularly, to an arrangement and a method to compensate for variations in the tip location, especially tip vibrations of an emitter tip. More specifically, embodiments described herein relate to a charged particle beam apparatus as well as to a method of compensating variations in an emitter location of a charged particle beam apparatus.

2. Description of the Related Art

Charged particle beam apparatuses are used in a plurality of industrial fields, including, but not limited to, high resolution imaging and processing of samples, inspection of semiconductor devices during manufacturing, exposure systems for lithography, detecting devices and testing systems. There is a high demand for structuring, testing and inspecting specimens within the micrometer and nanometer scale. Micrometer and nanometer scale process control, inspection, or structuring is often done with charged particle beams, (e.g., electron beams). Charged particle beams offer superior spatial resolution compared to, for example, photon beams due to their short wavelengths.

Although the prior art and embodiments of the present invention will be described in the following with reference to electrons, electron beams, electron emitters, or electron microscopes, those skilled in the art will understand that the explanations are also true for other charged particles, such as ions, ion beams, ion emitters, etc.

The first step in the process of creating images in any electron microscope is the production of an electron beam. The electron beam is generated in a device often called an electron gun. Three major types of electron guns are used in electron microscopes: tungsten-hairpin filament guns, lanthanum-hexaboride ($LaB_6$) guns, and field-emission guns. Field-emission guns offer several advantages over tungsten-hairpin filament guns or $LaB_6$ guns. First, the brightness may be up to a thousand times greater than that of a tungsten gun. Second, the electrons are emitted from a point more narrow than that in the other sources. Thus, superior resolution is achieved by field-emission guns compared to tungsten or $LaB_6$ guns. Furthermore, the energy spread of the emitted electrons is only about one-tenth that of the tungsten-hairpin gun and one-fifth that of the $LaB_6$ gun. Finally, the field-emission gun has a very long life, up to a hundred times that of a tungsten gun. For these reasons, the field-emission gun is a good choice for a number of applications.

Figure 9A:
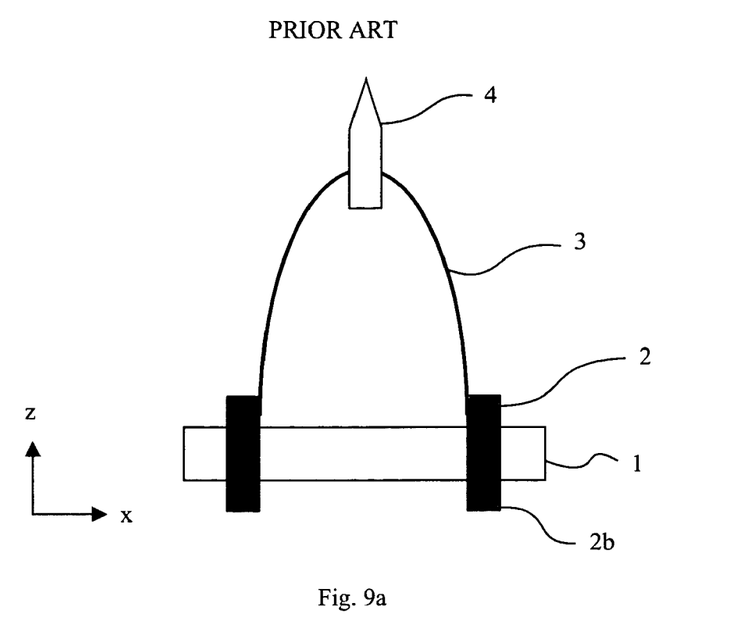
FIG. 9a shows a front view of an emitter according to the prior art.
Figure 9B:
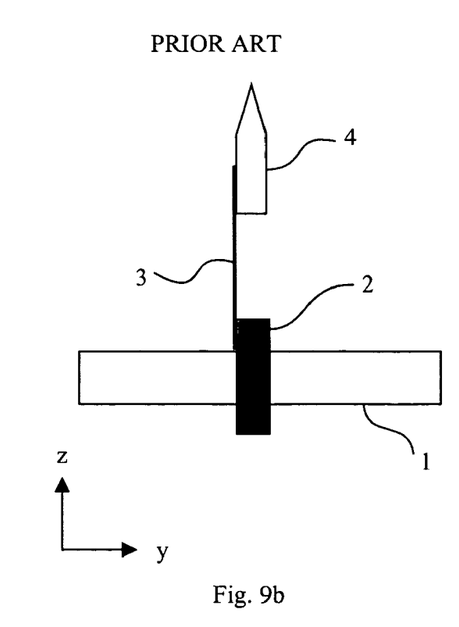
Figure 9C:
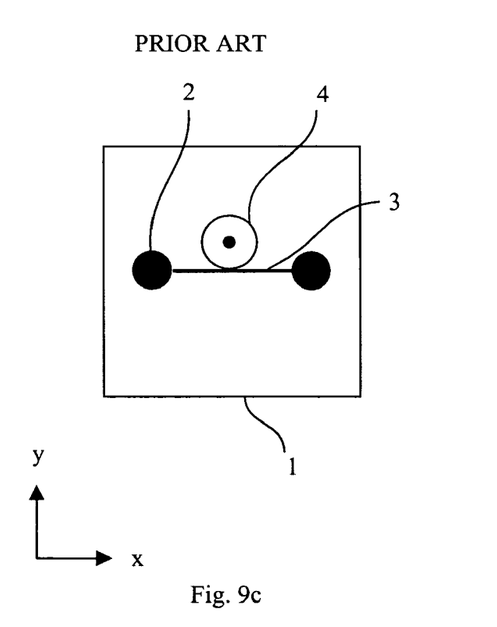

The typical construction of a conventional electron emitter, such as a thermal field-emission (TFE) gun, a cold field-emission (CFE) gun, or a field-assisted photocathode, is shown in FIGS. 9a to 9c. In FIG. 9a, the emitter assembly is mounted on an insulating ceramic base 1, which is normally a ceramic socket. A hairpin wire (support) 3 is attached to two metal support pins 2. The hairpin wire 3, which is made typically out of tungsten, can also be used as a heater in cases where the emitter requires heat for normal operation, for cleaning, for processing or for other reasons. The emitter 4 is supported by a supporting member formed by the base, the support pins and the hairpin wire (filament). Typically, the bent tungsten wire 3 is attached to support pins 2 by spot welding. The rear end 2b of the support pins are used as connection terminals. A very finely curved sharp tungsten tip serves as the emitter tip (particle beam source) 4 and is attached to the bent tungsten wire 3. Typically, the emitter tip 4a is attached to the heating filament 3 by spot welding.

However, the conventional field-emission gun shown in FIGS. 9a to 9c suffers, for example, from mechanical vibration of the emitter. Mechanical vibrations of the emitter tip significantly limit the achievable resolution. This applies to many corpuscular beam systems, but in particular to scanning particle beam systems.

Figure 9D:
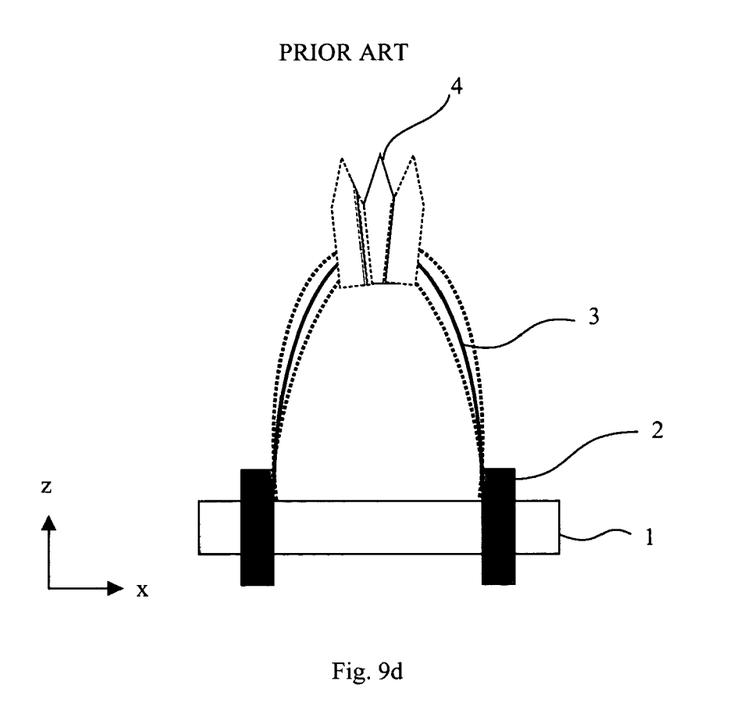

The problem of mechanical vibration will be explained with reference to FIGS. 9d and 9e. FIG. 9d shows a first vibrational mode of the conventional field-emission gun shown in FIGS. 9a to 9c. In this first vibrational mode, the emitter tip 4a undergoes a displacement in the x-direction. However, the emitter configuration is stiff in the x-direction so that such a displacement in x-direction corresponds to a higher order vibrational excitation which may even include torsion movements of the heating filament 3. Accordingly, such a high order vibrational mode has a very high eigenfrequency and is strongly damped. Therefore, this first vibrational mode has only a very small amplitude and, therefore, has not yet been observed in experiments.

Figure 9E:
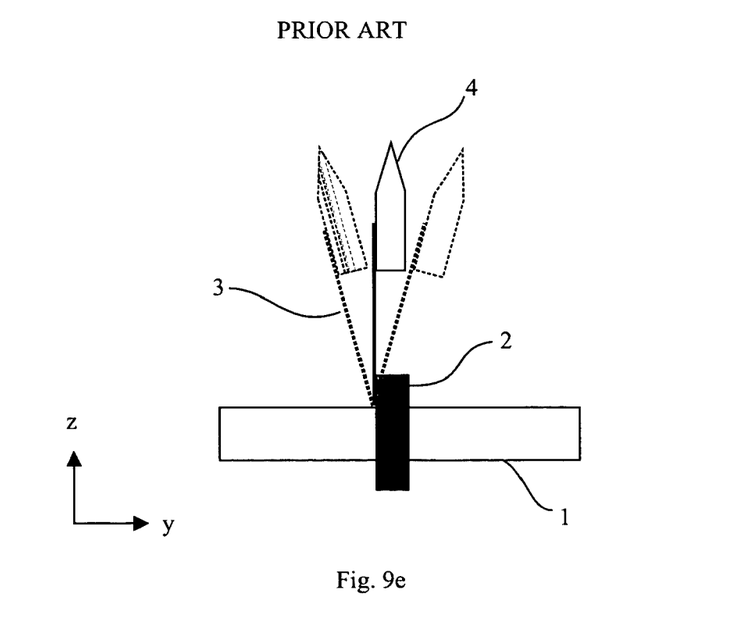

FIG. 9e shows a second vibrational mode of the conventional field-emission gun shown in FIGS. 9a to 9c. In this second vibrational mode, the emitter tip 4a undergoes a displacement in the y-direction. This displacement in the y-direction is caused by bending of the heating filament 3. While being stiff in the x-direction, the emitter configuration is not very stiff in the y-direction so that a bending movement of the heating filament 3 in the y-direction corresponds to a lower order vibrational mode. Typically, this second vibrational mode of the emitter has an eigenfrequency of about 2 kHz. Furthermore, the damping is not very strong so that the second vibrational mode has a considerable amplitude. In fact, this amplitude may be so large, (e.g., within the nanometer range) that it can be observed in an experiment. Consequently, the displacement of the emitter tip 4a in the y-direction limits the resolution of some electron microscopes, especially for hairpin sources with an emitter needle welded on top of the hairpin, which are used in many applications like scanning electron microscopes (SEMs), focused ion beams (FIBs), writing and modification tools.

In particular, the second vibrational mode can be introduced by vibrations of the system or acoustic noise. The frequencies of these vibrations are in the kHz regime, and amplitudes of several nanometers can occur. The tip vibrations become resolution-limiting in particle beam system with particle beam sources of small (virtual) size. Examples are cold field emitters (CFEs) in electron-beam technology, which have a virtual sources size of about 3 nm. Ion beam technology sources with small effective diameters are also known.

In the past it has been suggested to stabilize the emitter tip by adding an additional filament, that is a third wire, which may then be arranged, for example, in an angle of 90° to the filament shown in FIGS. 9a to 9e. Thereby, particularly the second vibrational mode is intended to be reduced. Such a device can increase the stability or stiffness of the arrangement to a certain degree. Nevertheless, when the tip is heated through the wire, an arrangement having more than two connections to the terminal positioned in one plane may introduce a drift due to deformation of the wires. Further, it is still difficult to guarantee a very high stability. For high resolution applications, with a resolution of 1 nanometer or below, stability of 1 nm or below would need to be guaranteed.

SUMMARY OF THE INVENTION

One embodiment of the present invention provides a charged particle beam apparatus. The charged particle beam apparatus generally includes a charged particle beam source (composed of an emitter with an emitter tip and a supporting member configured to support the emitter), an emitter location measuring device configured to repeatedly measure the location of the emitter, and a deflector system configured to compensate for variations in the location of the emitter.

Another embodiment of the present invention provides for a charged particle beam apparatus. The charged particle beam apparatus generally includes a charged particle beam source (composed of an emitter with an emitter tip and a supporting member configured to support the emitter), an emitter location measuring device configured to repeatedly measure the location of the emitter, and a stage positioning system adapted to compensate for variations in the location of the emitter.

Yet another embodiment of the present invention is a method of compensating variations in an emitter location of a charged particle beam apparatus. The method generally includes measuring the emitter location of a charged particle beam emitter of the apparatus and compensating for variations in the emitter location.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1b shows another side view of the embodiment shown in FIG. 1a;

FIG. 2b shows another side view of the embodiment shown in FIG. 2a;

FIG. 9b shows a side view of the prior art emitter shown in FIG. 9a;

FIG. 9c shows a plan top view of the prior art emitter shown in FIG. 9a;

FIG. 9d shows a first vibrational mode of the prior art emitter shown in FIG. 9a;

FIG. 9e shows a second vibrational mode of the prior art emitter shown in FIG. 9a;

DETAILED DESCRIPTION

Embodiments of the present invention provide an emitter configuration with improved resolution due to compensation of variations in the location of the (virtual) emitter source. Further, variations in the relative position of the stage with respect to the charged particle beam column may be compensated for, and emission stability may be provided.

Generally, references to vibrations of the emitter and/or the stage should be understood as an explanation of variations of the location of the emitter and/or stage. Nevertheless, vibrations are one kind of variation of the location of the emitter and/or the stage that may be particularly considerable. Other variations of the location can be introduced due to thermal drift, misalignment or insufficient positioning of movable components.

Generally, the material for the hairpin wires and for the emitter tips, as described herein, is tungsten. However, independent of specific embodiments, the hairpin wire may also include tantalum or other suitable materials. Further, the emitter tip, which is often described as being a tungsten emitter tip, may also be made of other materials like carbon, diamond, tantalum and the like. The emitter tip may typically be a single crystal or amorphous.

Figure 1A:
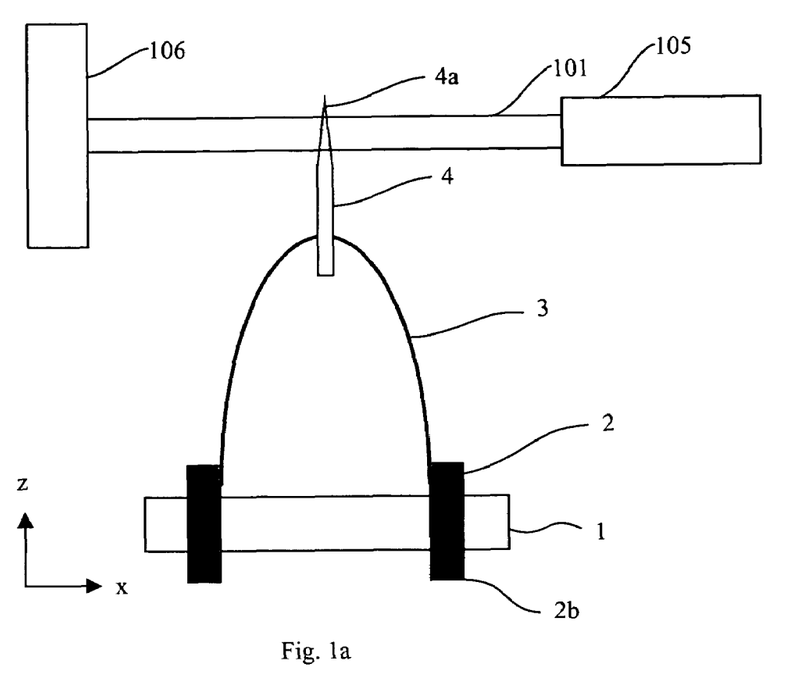
FIG. 1a shows a side view of an emitter and an emitter location measuring system according to an embodiment of the invention.
Figure 1B:
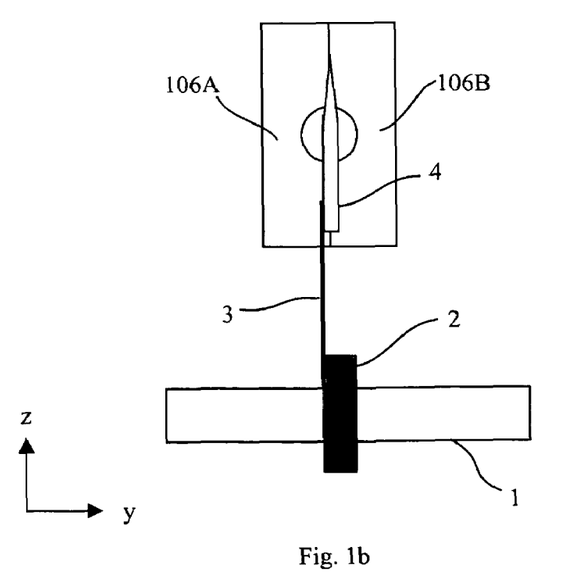

FIGS. 1a and 1b show side views of a first embodiment according to the present invention. FIG. 1a is a side view in the z-x-direction. FIG. 1b is a side view in the z-y-direction. An emitter configuration for an electron beam apparatus is shown. Emitter needle 4 with emitter tip and filament 3 may be supported by a ceramic base 1. To form the filament 3, the wire, which may include tungsten, tantalum or other suitable materials, may be bent into the loop, and the free ends of the loop may be attached to the first and second support pins 2 by any suitable means, such as spot welding. The support pins 2 may be made of metal and extend through the ceramic base 1 so that electrical contact can be made to the filament 3 via the support pins 2. An emitter tip 4a made of the tungsten crystal which has been formed into a very sharp tip may be spot welded to the filament. It can be seen that a base 1, which is typically a ceramic socket may hold a support wire 3 via support pins 2.

The hairpin wire (support) 3 may be attached to two metal support pins 2. As the hairpin wire 3 may typically be made out of tungsten, tantalum or other suitable materials, it may also be used as a heater in cases where the emitter requires heat for normal operation, for cleaning or for other reasons. The rear ends 2b of the support pins 2 may be used as connection terminals for control of the emission source. A very finely curved sharp tungsten tip may serve as the emitter tip (particle beam source) 4a and may be attached to the bent tungsten wire 3. Typically, the emitter 4 is attached to the heating filament 3 by spot welding.

Because of the mechanical design, this device may be sensitive to tip vibrations, in particular to the vibrational mode shown in FIG. 9e. Nevertheless, the design may also have benefits, such as easy and low-cost setup, insensitivity to temperature drift, good thermal isolation from the needle to the base, and the like. For example, a temperature drift may only cause a movement in the z-direction, which can be compensated by adjusting the imaging properties of the lens or the lenses in the column.

In view of the above, in the first instance, it is not intended to provide a stable mechanical design, which may also provide the other benefits. In the first instance, it is rather proposed to measure the tip vibrations and compensate for the measured vibrations.

Accordingly, the vibrations of the tip may be measured. The movement of the emission source resulting from the vibrations may then be compensated by compensating means arranged in the charged particle beam path. These compensating means may be arranged between the source and the specimen. Such compensating means, which may, for example, be deflectors in single stage, double stage or even higher stage arrangements, may be adapted to change the beam path such that it seems that the emitter location would move, when seen from the specimen side of the charged particle optics. The compensation means, for example, in the form of a deflector system, will be described in more detail below.

The embodiment of FIGS. 1a and 1b shows an example of a contact-less measurement of the tip vibrations. Generally, without being limiting to this embodiment, contact-less measurement principles for measuring the tip vibrations are typically used.

A light source 105, which may be a laser, may emit a light beam 101. The light beam 101 may be shaped to be a collimated beam. The light beam 101 may hit parts of the emitter needle and/or the emitter tip 4a. Alternatively or additionally, according to other embodiments (not shown), the light beam may also hit parts of the filament 3. Thereby, parts of the light beam may be blocked by the emitter. The rest of the emitted light may be detected with detector 106. The laser and the detector may provide an emitter location measuring device. Detector 106 may be a segmented array with, for example, two segments 106A and 106B. The "shadow" of the emitter which is projected onto the detector may result in a difference of the signals from segment 106A and 106B depending on variation of the tip location. Thus, a vibration of the tip in the y-direction can be determined based on the intensities measured by the segments of the detector.

Generally, it may be preferred to use a laser beam as the light beam. The short bandwidth may improve optical imaging of the light beam and therefore, may simplify the measurement of, for example, the signal difference between segments 106A and 106B. Further, some measuring arrangements, which may be applied, require the coherence of the laser to conduct the measurement. One example may be an interferometer that may also be used for measuring the amount and the frequency of the tip vibrations.

Figure 2A:
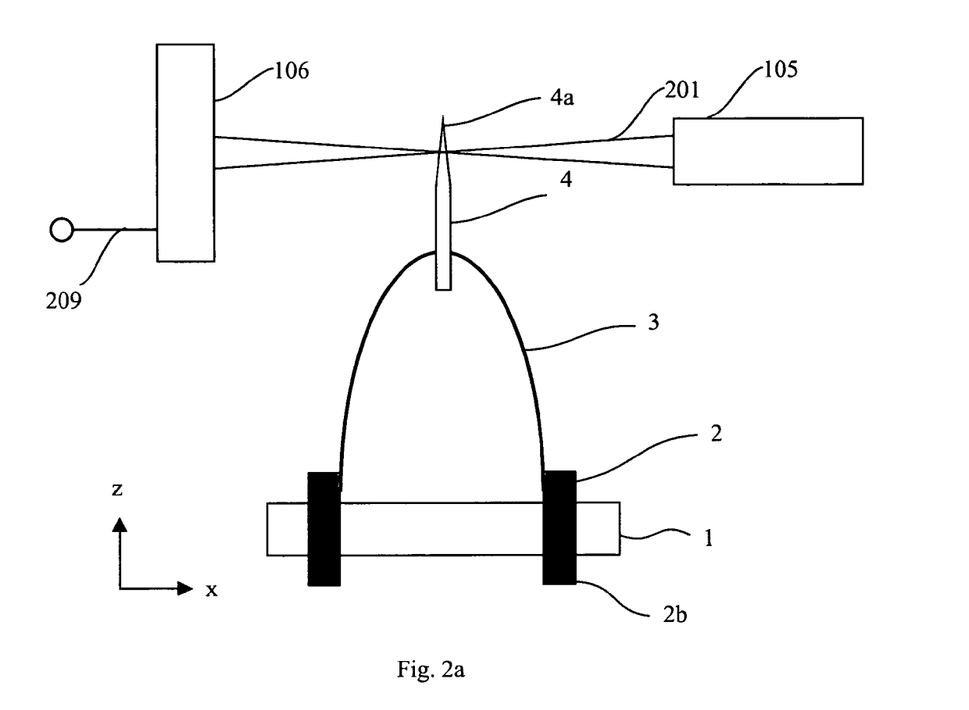
FIG. 2a shows a side view of an emitter and an emitter location measuring system according to an embodiment of the invention.
Figure 2B:
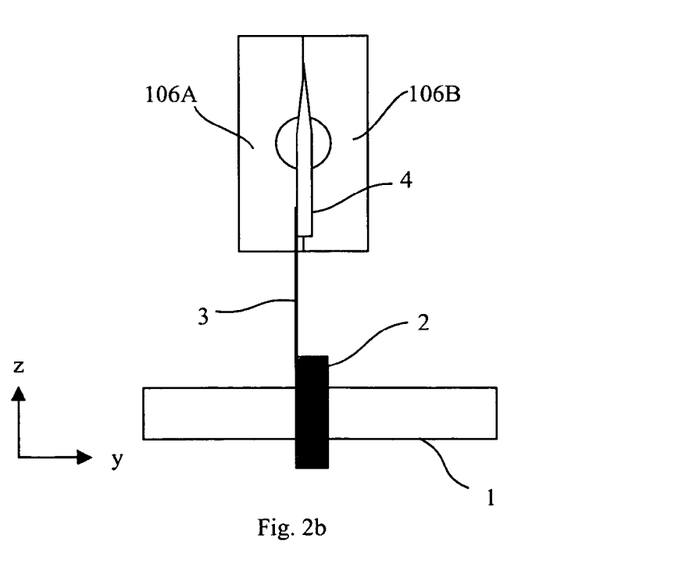

FIGS. 2a and 2b show a further embodiment, which is fairly similar to the embodiment shown with respect to FIGS. 1a and 1b. FIG. 1a is a side view in the z-x-direction. FIG. 1b is a side view in the z-y-direction. However, within the embodiment of FIGS. 2a and 2b, the light beam 201 is a focused light beam. The focus of the light beam is at the position or close to the position of the emitter. On one hand, depending on the momentary position of the emitter with regard to a vibrational cycle, the light beam may be blocked to a larger extent. On the other hand, more intensity may pass the light beam if the emitter swings away from the focused light beam. Thus, the signal intensity difference between segments 106A and 106B may be increased by focusing the light beam.

If the emitter needle is positioned at the position of the focus, the light beam might be blocked for both segments 106A and 106B of detector 106. This may result in reduced sensitivity for emitter positions with entirely blocked light beam. Thus, the focus might be positioned, for example, about 1 to about 5 mm before or behind the location of the needle in the x-direction. By adjusting the distance of the focus from the measuring position (needle or wire), the size of the shadow and the differences in intensity may be adjusted.

If the emitter tip were imaged onto a detector array to, thereby, measure the vibration of the tip, the resolution of the measurement may be limited to be within the order of the wavelength of the light beam. Using UV light might thereby increase the resolution. However, a measurement in the nanometer range may not be possible by merely imaging the emitter tip and following the image of the tip. Therefore, signals other than the image on a camera should be used.

One example to measure the vibration of the emitter tip within the nanometer range and in a range up to several 100 kHz is the measurement of the intensity on different segments, as described above with respect to segments 106A and 106B.

Further, reflected light may be used as will be described with respect to another embodiment below. Generally, the intensity distribution of reflected light or of light passing by an obstacle is highly sensitive to the distance of the obstacle from, for instance, the entrance of a fiber optic. For example, if in one multi-fiber a first half of the fibers are used to provide laser light to an obstacle (e.g., the emitter tip) and the rest of the fibers are used to collect the reflected light, a vibrational detector with a resolution in the nanometer range and a frequency response in the several 100 kHz range may be realized.

Alternatively for transmitted light, two multi-fibers may be used to provide a light curtain. Thereby, a plurality of emitting fibers may be provided on one side of the emitter needle, and a plurality of receiving fibers may be provided on the other side of the emitter needle. In between, the emitter and/or the filament as an obstacle may block the light of some fibers. The light of other fibers may not be blocked. Thus, the summed up intensity may be used as a measure of how far the emitter reaches into the light curtain. The above measurements and especially combinations thereof may allow for vibrational detectors with a resolution in the range of Angstroms and a frequency response of up to several 100 kHz.

These effects described in detail with regard to multi-fiber optics may also be utilized with other optical systems. Generally, the intensity of the transmitted and/or reflected light may be used as an indicator of the emitter needle/tip location in the light beam path. Other effects, like the Doppler Effect, may also be used or combined with the different kind of measurements described above.

For some embodiments (not shown), an emitter location measuring device in the form of an interferometer may be used in order to measure the vibration of the emitter tip. Thereby, a mirror may be positioned along the direction of the vibration to be measured. For some embodiments, the mirror may either be attached to the emitter needle or to the hairpin wire. Alternatively, a flat within the emitter needle that acts as a mirror may be provided. An interferometer using, for example, a He—Ne laser may then be capable of measuring the vibrations of, for example, the second vibrational mode with a resolution of about 0.1 nm at a frequency of about 500 kHz.

With respect to the above-described embodiment, which utilizes an interferometer, a second laser beam might be directed to the housing of the gun (i.e., the housing of the emitter) in an effort to provide a reference of the measured emitter location variations relative to the gun housing. Thereby, particular drifts of the emitter tip and/or the emitter configuration including the ceramic base and the filament may be measured. These drifts can, thereby, be determined relative to the gun housing, in which the emitter configuration is positioned.

According to another embodiment (not shown), an interferometer system can be provided including two interferometer axes. One axis may be oriented along a first direction (e.g., y-direction) and one axis along a second direction (e.g., x-direction), which is essentially perpendicular to the first direction.

Figure 3:
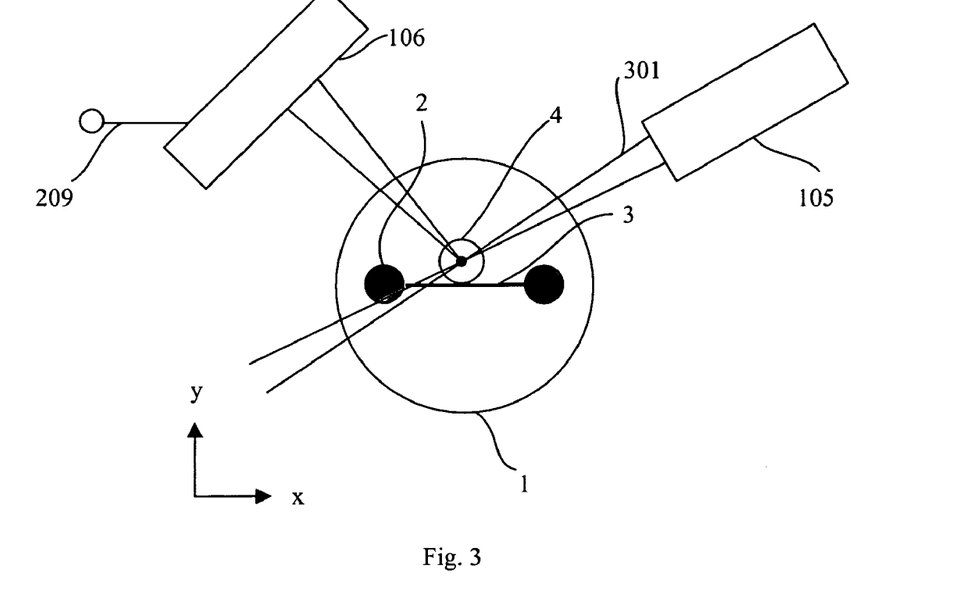
FIG. 3 shows a top view of an emitter and an emitter location measuring system according to an embodiment of the invention.

An exemplary arrangement describing a measurement with reflected light is shown in FIG. 3. The light beam 301, which may either be focused or collimated and which may be emitted by laser 105, may be guided onto the emitter or the hairpin. Upon vibration of the emitter the light intensity and light direction, which is reflected to detector 106, may change. Detector 106 may be a segmented array with, for example, two segments. If vibrations occur, the light guided onto the detector may result in a difference of the signals from the individual segments. Thus, a vibration of the tip in the x- and/or y-direction may be determined based on the intensities measured by the segments of the detector. The position of the emitter or the vibrational amplitude and frequency, respectively, may be measured. A corresponding signal may then be output to signal output 209. In an effort to improve the reflection properties of the hairpin or the needle or to adapt the reflection (to provide more accurate measurement results), a flat, which acts as a mirror, may be provided. The flat may either be formed in the needle or the hairpin, or it may be attached to the needle or hairpin.

In the above-mentioned embodiments, either the hairpin or the source needle may be used as a measurement point. Generally, the movement of the tip end is to be compensated for. More precisely, a variation of the location of the virtual point of emission of the emitter tip should be corrected.

Figure 11:
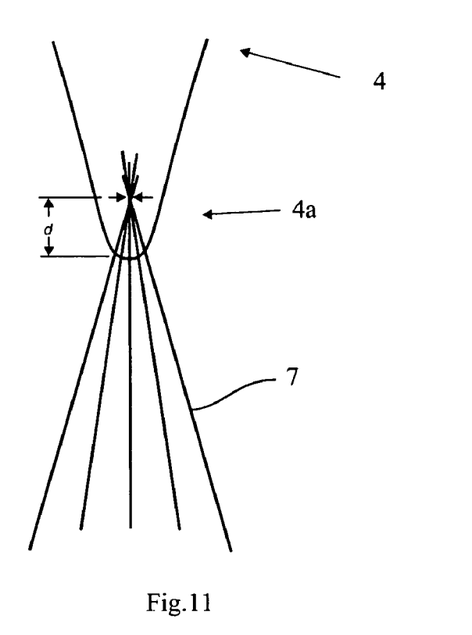
FIG. 11 is a schematic drawing for explaining the virtual emitter source according to an embodiment of the invention.

This might be better understood with reference to FIG. 11. FIG. 11 shows the tip 4a of an emitter 4. Beams 7 may be emitted from the emitter 4 as indicated by the rays shown. These rays may have a virtual emission source that is located at a distance d from the very tip end of emitter tip 4a. The virtual emission source may be located within the emitter tip 4a.

In view of the above, a measurement point close to the emitter tip, at which the vibration is measured, may provide a result that better correlates to the movement of the emitter tip. In cases where the vibration of the hairpin or a bottom part of the needle is measured, the measurement results may be transformed to a movement of the tip end of the emitter needle.

Figure 4:
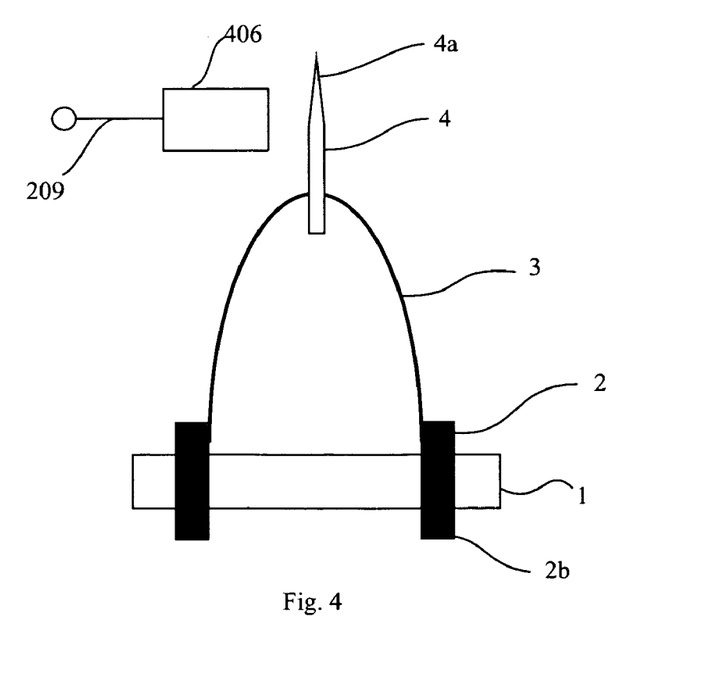
FIG. 4 shows a side view of an emitter and a measuring system according to an embodiment of the invention.

According to a further embodiment, other measuring devices may also be used. FIG. 4 shows a capacitive or inductive distance measuring device 406 as an emitter location measuring device. A signal indicative of the amplitude of the vibration and the frequency may be output by signal output 209.

A further embodiment will now be described with respect to FIG. 5a. Therein, the measuring system which is shown in FIG. 3, including the laser 105 and the detector 106, may be used. An emitter configuration for an electron beam apparatus is shown. Emitter needle 4 with emitter tip and filament 3 may be supported by a ceramic base 1. To form the filament 3, the tungsten wire may be bent into the loop, and the free ends of the loop may be attached to the first and second support pins 2 by a suitable means, such as spot welding. Instead of tungsten, tantalum (e.g., for ion source) or other suitable materials may also be used. The support pins 2 may be made of metal and may extend through the ceramic base 1 so that electrical contact can be made to the filament 3 via the support pins 2. An emitter 4 made of the tungsten crystal which has been formed into a very sharp tip may be spot welded to the filament. A base 1, which is typically a ceramic socket, may hold a support wire 3 via support pins 2.

The hairpin wire (support) 3 may be attached to two metal support pins 2. A third support pin 5 may be provided. Like the first and the second support pins 2, also this third support pin 5 may also be made of metal and may extend through the ceramic base 1. Alternatively, the third support pin may not extend through the base, but may be provided in the form of a stabilization point on the base. A stabilization element 6 may be attached to the third support pin 5 and to the filament 3 adjacent to the emitter tip. Typically, this stabilization element 6 may be formed of tungsten wire like the filament 3 and may be spot welded to the third support pin 5 and the filament 3. However, for some embodiments, stabilization element 6 may merely abut against the filament in a resilient manner. Thereby, vibrations of filament 3 may be reduced due to the spring forces of the stabilization element 6 acting on filament 3. Alternatively, the stabilization element 6 may be formed of other materials, or it may be integrally formed with the emitter tip.

Figure 5A:
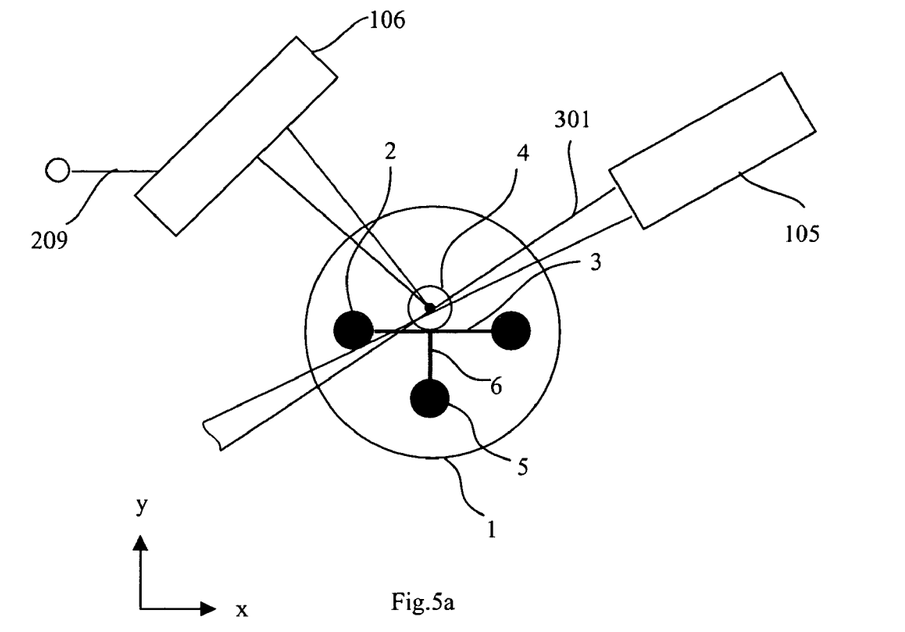
FIG. 5a shows a top view of an amended emitter and an emitter location measuring system according to an embodiment of the invention.

The emitter configuration shown in FIG. 5a may reduce vibrations of the emitter tip of emitter needle 4. In FIG. 5a, these reduced vibrations may be measured by the optical measuring system including laser 105 forming focused light beam 301. The reflected light may be detected similarly to the embodiments shown in FIG. 3 by detector 106.

Stabilizing the emitter tip as described with respect to FIG. 5a may be applied to all embodiments described above. The stabilization may be used independently of the measurement arrangement for detecting the position of the emitter tip.

Figure 5B:
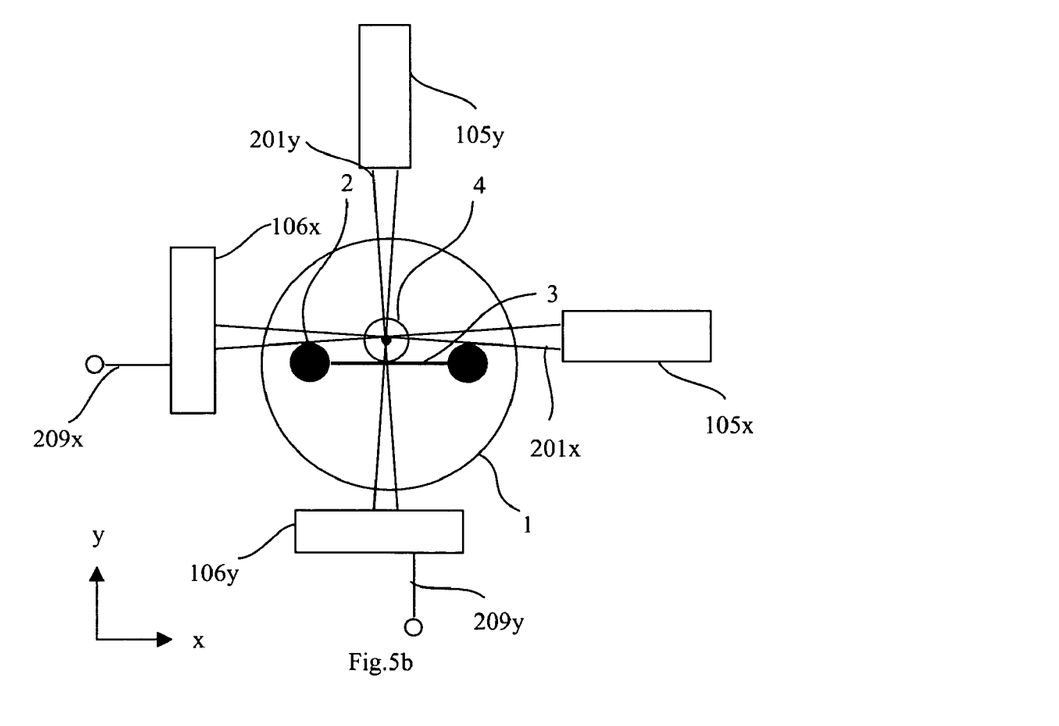
FIG. 5b shows a top view of an emitter and a measuring system according to an embodiment of the invention.

Referring now to FIG. 5b, a system similar to FIGS. 2a and 2b is shown. Within the embodiment of FIG. 5b, the light beams 201x and 201y may be focused light beams.

Two light beam sources 105x and 105y may be provided, and two segmented detectors 106x and 106y may be provided. Thereby, a variation in the location of the emitter tip along the x-direction (e.g., a vibrational mode as shown in FIG. 9d) and a variation of the emitter tip along the y-direction (e.g., a vibrational mode as shown in FIG. 9e) may be measured by two independent units. The variations in the x-direction and the y-direction may both be measured. In the embodiment of FIG. 5b, two measurement results may be output to signal outputs 209x and 209y. Alternatively, a combined x-y measurement may be conducted by an x-y measurement unit, and one signal, indicative of x-displacement and y-displacement, may be provided by a signal output.

Independent of specific embodiments, a measurement in x-direction and y-direction to measure variations in the location of the emitter tip in x-direction and in y-direction may be used for all emitter location measuring devices and all charged particle beam apparatuses disclosed herein. Thereby, typically a second measuring assembly is included in the measuring device.

Within FIG. 5b, the focus of the light beam is at the position or close to the position of the emitter. On the one hand, depending on the momentary position of the emitter with regard to a vibrational cycle, the light beam may be blocked to a larger extent. On the other hand, more intensity may pass the light beam if the emitter swings away from the focused light beam. Thus, the signal intensity difference between segments 106A and 106B may be increased by focusing the light beam.

If the emitter needle is positioned at the position of the focus, the light beam might be blocked for both segments 106A and 106B of detector 106. This may result in reduced sensitivity for emitter positions with an entirely blocked light beam. Thus, the focus might be positioned, for example, about 1 to about 5 mm before or behind the location of the needle in the x-direction. By adjusting the distance of the focus from the measuring position (needle or wire), the size of the shadow and the differences in intensity may be adjusted.

The above-described embodiments for measuring the source location, filament location or emitter location may result in an emitter location signal $S_{location}$. A suitable calibration device may generate a correction signal $S_{correction}$ from this location signal. The correction signal may drive a deflection arrangement that is a correction deflector of a deflector system. The deflection arrangement may compensate for the movement of the tip/source with nanometer precision or below. The calibration device may take into account, for example, the distance of the emitter tip with respect to the position on which the location signal has been measured.

Generally, for measurement principles based on segmented detectors, a detector array with a higher number of segments may be used. For example a 2×2, 4×4, or detectors with up to several thousand (e.g., 4096) segments may be used.

Generally, all optical measurements described herein may be conducted by lens optics, whereby lenses are used for focusing, collimating, projecting or imaging a light beam, particularly a laser beam. Alternatively, or in combination, fiber optics may be used to guide the light beam to and from the emitter and/or the support wire. Thereby, it may especially be useful to utilize a multiple fiber to guide the light beams to and from the emitter. This will be explained in more detail below.

Without being limited to one of the embodiments, the measuring arrangements described herein may be used for measuring the location of the tip and, as one example, therefore, the vibration of the tip. A general variation in the location may—besides vibrations—also be introduced due to misalignment or a drift of the emitter tip that can be introduced by temperature changes or the like.

Figure 6:
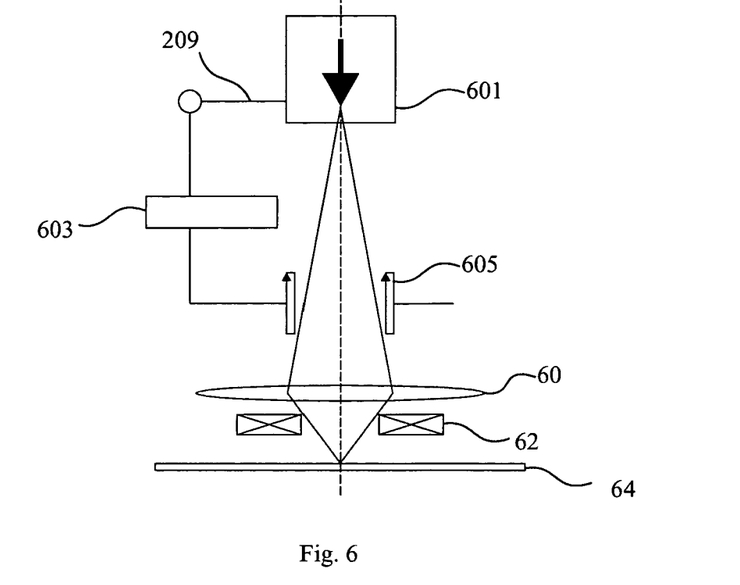
FIG. 6 is a schematic drawing of a charged particle beam apparatus including a measuring system and a vibration compensation deflector system according to an embodiment of the invention.

The deflection arrangements will now be described with respect to FIGS. 6 to 8. FIG. 6 shows a charged particle beam apparatus, which emits, for example, electrons. However, ions may also be emitted. The source arrangement 601 may include the emitter tip and the emitter location measuring device, as described above. The charged particle beam emitted by the source may be focused onto specimen 64 by objective lens 60. Scan system 62, which is exemplarily shown as a magnetic deflection system including deflection coils, may scan the charged particle beam over specimen 64.

The emitter location signal or source location signal $S_{location}$ may be fed from signal output 209 to the calibration amplifier 603 generating the correction signal $S_{correction}$ from the emitter location signal. The correction signal may be provided to the correction deflectors 605. Within FIG. 6 these deflectors of the deflector system are shown as electrostatic deflectors. However, the correction deflectors of the deflector system may also be magnetic or combined magnetic-electrostatic. FIG. 6 shows a single stage correction deflector system, which may typically be capable of deflecting the beam in x-director and y-direction. Alternatively, a two-stage or the three-stage deflector system may be used as a correction deflection system. The correction deflectors in the system may deflect the charged particle beam according to the correction signal, which has been generated in an effort to compensate for the measured variations of the tip/source location. Thus, the vibrations of the emitter tip may be compensated by deflecting the beam with correction deflectors 605 of the deflector system.

The deflector system may include electrostatic, magnetic or combined magnetic-electrostatic deflectors. It may be a single-stage, double-stage or even higher order stage system. Further, other compensation means and/or other means for deflecting the charged particle beam with respect to the specimen and, thus, compensating variations in the location of the virtual emission source may be applied. As one example, the sample may be retained on a piezo-table adapted to precisely move the sample in the x-direction and y-direction. Thereby, the variations in the relative position of the charged particle beam and the sample may also be compensated for. As another example, the deflection for compensating variations of the emitter location may also be added to the scan deflector system. Thus, the scan unit may act as a scanning unit and as a deflector system for compensation of variations of the emitter location.

FIG. 6 shows the charged particle optics with a single lens. Nevertheless, more than one lens may be used in the charged particle beam column without departing from the scope of the present invention. For example, a condenser lens and an objective lens may be provided. The same applies to the other charged particle optical columns described in the present application.

Figure 7:
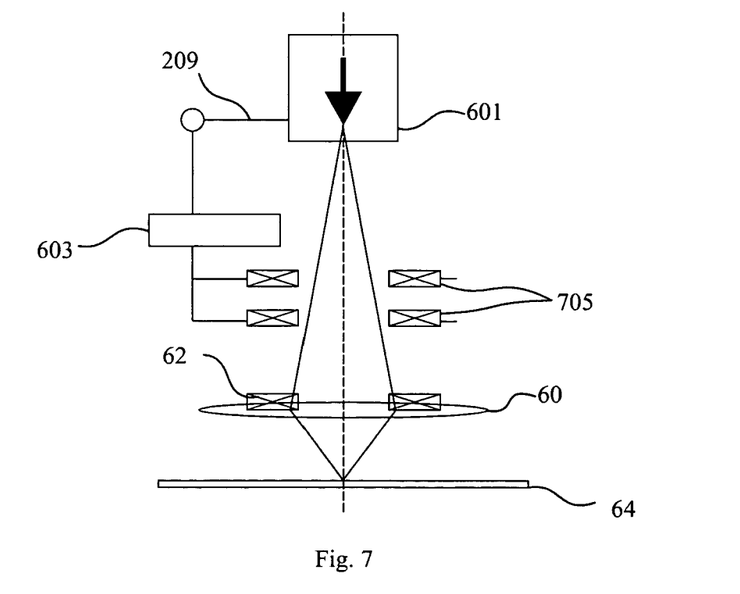
FIG. 7 is a schematic drawing of a charged particle beam apparatus including a measuring system and a vibration compensation deflector system according to an embodiment of the invention.

FIG. 7 shows a further embodiment of the charged particle column. As compared to FIG. 6, a two-stage correction deflection system 705 with magnetic deflectors may be provided. The scan deflection system 62 may be positioned to be an in-lens deflection system in order to be able to provide a reduced focal length of the objective lens.

Figure 8:
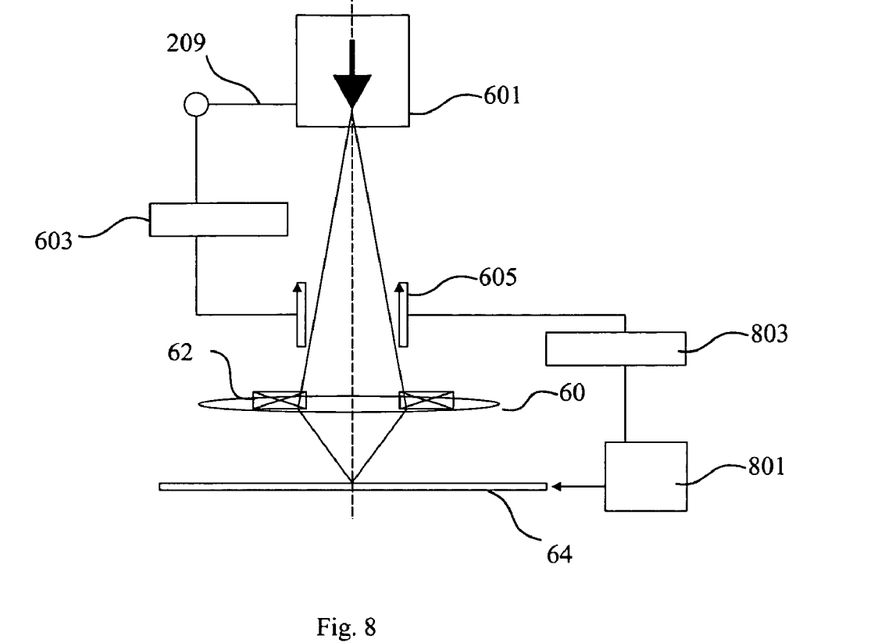
FIG. 8 is a schematic drawing of a charged particle beam apparatus including a measuring system and a vibration compensation deflector system according to an embodiment of the invention.

A further embodiment is shown in FIG. 8. In a high-resolution system, both the source stability and the sample stability are issues. Therefore, in addition to the above-mentioned embodiments, the sample location or the stage location may be measured by stage location measuring system 801. The stage location measuring system 801 may be, for example, an interferometer. For such an interferometer, a laser beam may be directed onto the stage along the x-direction and along the y-direction.

According to a further embodiment, the position of the stage may be optionally measured with respect to the charged particle optical system that is the column. As mentioned above, the stage location measuring system may include an interferometer for each of the x- and y-directions. In order to measure the position of the stage or vibrations of the stage with respect to the charged particle optical system, an interferometer with laser beam impinging on the charged particle beam column may also be applied for the x- and the y-direction. Typically, the reference laser beam for measuring the column position as a reference for the stage position is directed onto the objective lens. Thereby, the stage is measured with respect to the optical element, which usually defines the optical axis of the column.

Referring now to FIG. 8, the corresponding sample location signals (x and y), which may be indicative of a misalignment or a vibration of the stage and/or the column, may be fed to a stage calibration amplifier 803 generating a correction signal. The correction signal may be provided to the correction deflectors 605. The correction signal originating from the stage may be applied to the correction deflectors independently from the correction signal originating from the source. Alternatively, the correction signals of the source/tip and the sample/stage may be combined into one correction signal. The combined correction signal may compensate for variations in the tip location and the sample location. The combined correction signal may then be used to control the correction deflectors 605.

Figure 12:
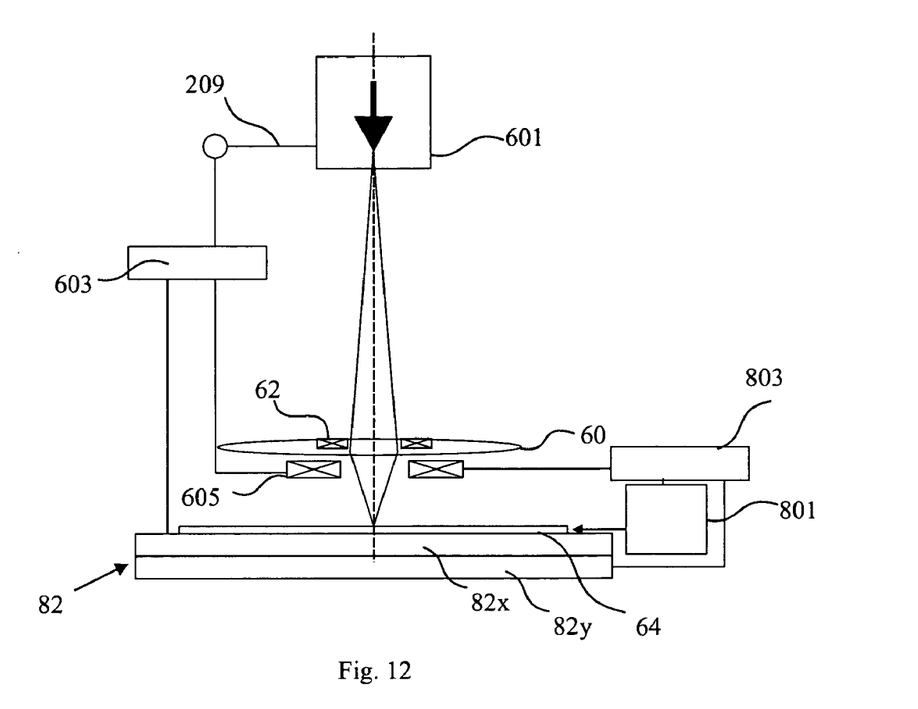
FIG. 12 is a schematic drawing of a charged particle beam apparatus including a measuring system and vibration compensation units according to an embodiment of the invention.

Other embodiments with further compensation mechanisms are explained with respect to FIG. 12. FIG. 12 shows a charged particle beam apparatus, which emits, for example, electrons. However, ions may also be emitted. The source arrangement 601 may include the emitter tip and the emitter location measuring device, as described above. The emitter location measuring device may either include one emitter location measuring assembly for measuring variations in the location of the emitter along one direction. This may generally be the more relevant vibrational mode. Alternatively, it includes two measuring assemblies for measuring variations in the emitter location along a first direction (e.g., y-direction) and a second direction (e.g., x-direction). Yet, the emitter location measuring device may include a measuring assembly capable of measuring both directions.

The charged particle beam emitted by the source may be focused onto specimen 64 by objective lens 60. Scan system 62, which is exemplarily shown as a magnetic deflection system including deflection coils, may scan the charged particle beam over specimen 64. For the embodiments described herein, electrostatic scan deflectors or combined magnetic-electrostatic scan deflectors may also be provided in the scan system.

The emitter location signal or source location signal $S_{location}$ may be fed from signal output 209 to the calibration amplifier 603 generating the correction signal $S_{correction}$ from the emitter location signal. The correction signal may be provided to the correction deflectors 605.

Within FIG. 12, these deflectors of the deflector system are shown to be post-lens deflectors. The deflector system may be positioned between the objective lens and the specimen or stage. Thereby, a deflection for compensating variations of the electron beam may not have influence on the focusing properties of the column. The deflection system shown in FIG. 12 is a magnetic single-stage deflection system. The correction deflectors in the system may deflect the charged particle beam according to the correction signal, which has been generated in an effort to compensate for the measured variations of the tip/source location. Thus, the vibrations of the emitter tip may be compensated by deflecting the beam with correction deflectors 605 of a deflector system.

According to another embodiment (not shown), an in-lens deflector system for compensation variations in the electron beam position may be provided. Thereby, the deflector system 605, which is shown in FIG. 12 as a post-lens system, may be moved up to be positioned within the lens, particularly within the active region of the lens.

According to an even further embodiment (not shown), the correction deflection with the scanning deflection of scan system 62 may be superposed. In the event of a magnetic deflection scan system as shown in FIG. 12, the correction signal may either be added to the scan signal, or the magnetic deflectors of the scan system may be provided with additional windings in the respective coils. Thus, one coil may be provided with scan deflection windings and with correction deflection windings. In the event, the scan system is provided as an electrostatic system, the correction signal may be added to the deflection system.

Returning now to FIG. 12, sample locations signals may be measured with the stage location measuring system 801. Stage location measuring system is typically an interferometer measuring the sample position in the x-y-direction and in the y-direction. If a reference for the sample location is used, a reference interferometrical beam may be directed to the objective lens of the column. Sample location signals (x and y), which may be indicative of a misalignment or a vibration of the stage and/or the column, may be fed to a stage calibration amplifier 803 generating a correction signal. The correction signal may be provided to the correction deflectors 605.

Within FIG. 12, the emitter location calibration amplifier 603 and the stage location calibration amplifier 803 may be further connected to a stage 82. Stage 82 may include positioning systems 82x and 82y. The movements of position systems 82x and 82y may allow for positioning of specimen 64 in the x-y plane.

The correction signals from the calibration amplifiers 603, 803 may be provided to the stage in an effort to compensate for variations of the emitter location and/or for variations of the sample location by movement of the stage. As explained above, a piezo-system in the stage may be included and, thereby, the sample may be moved as required for compensating the variations of the emitter location.

Generally, a piezo table, which is capable of moving the specimen in an x-y plane, may compensate the variation of the relative position of the charged particle beam and the specimen with high precision (nanometer-range) and in the kHz regime.

According to another embodiment, the compensation signals of the calibration amplifiers 603 and 803 may be divided into a (low frequency/constant) correction component for the stage and into a (higher frequency) correction component for the deflector system 605. If for example large corrections are compensated by the stage and the remaining smaller corrections are compensated by the deflector system, the field strength of the compensation deflectors may be reduced. Generally, low frequency or constant compensation signals, which can, for example, be necessary in view of a drift or the like, may be compensated for by stage movements. The deflector system may compensate with respect to compensation signals of all frequencies due to the higher bandwidth. However, a constant deflection with high field strength in the deflector system may complicate compensation with the deflector system 605. Therefore, this compensation may be swapped for other compensation means like the stage. To realize this divided compensation, a dividing unit for dividing the correction signal into a deflector system correction signal and a stage positioning correction signal may be included. When a divided compensation is utilized, a non-piezo, mechanical positioning system with a resolution in the μm-range may also be used as another alternative.

Those skilled in the art will understand that similar embodiments may also be provided, without a sample location calibration amplifier being involved in the compensation of the emitter vibrations. Thus, a stage positioning for compensation of variations in the location of the emitter may also be used for embodiments described with respect to FIGS. 6 and 7.

Figure 10:
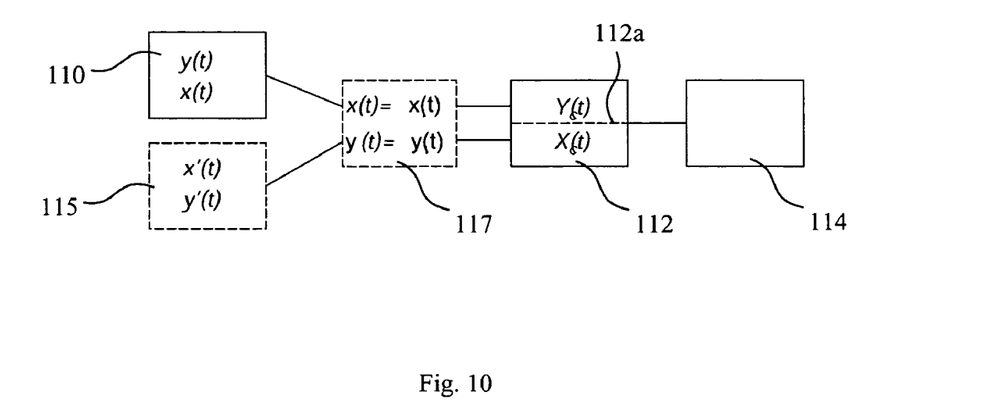
FIG. 10 is a flow chart to explain embodiments of compensating varying locations of an emitter in a charged particle beam system according to an embodiment of the invention.

In the following, embodiments of methods will be described with respect to FIG. 10. Thereby, dashed lines indicate optional method steps. Within step 110 the location of the emitter and/or the hairpin support wire may be measured. The location may be measured as a function of time for the x-direction and/or for the y-direction. Typically, the second vibrational mode shown in FIG. 9e is more critical. Thus, measurement of the y-direction may be sufficient. The location x(t) and y(t) may vary as a function of time t due to a drift or due to vibrations of the system.

In step 112, the location of the emitter may be transformed into a correction signal. Thereby, the position of the virtual source of emission with respect to the position of measuring the location y(t) (and/or x(t)) may be taken into account. The correction signal $Y_C(t)$ (and/or $X_C(t)$) may then be used to compensate for movements of the emitter tip within step 114. This may be accomplished by providing the correction signals to correction deflectors.

Optionally, within step 115, the location of the sample or the stage, respectively, may be measured. The location x'(t)/y'(t) may also be used to provide a correction signal to a deflector system. As indicated by dashed line 112a, the correction signals may either be generated independently for compensation of vibrations of the emitter and the stage, or a combined correction signal may be generated. If independent correction signals are generated, the signals may then be combined before control of the correction deflectors.

As a further option, one of the location signals or both of the location signals may be analyzed in step 117 before calculating the correction signals. Thereby, a drift may be separated from a vibration with a certain frequency. Further, if there is more than one vibrational mode at different frequencies, these vibrational modes may also be separated. Thereby, the correction signal may be calculated more precisely. For example, a drift measured at the hairpin wire may be converted to a correction signal without any magnification if the drift originates from a movement of the entire emitter source. A vibration may need to be converted with a magnification depending on the distance of the virtual emission source from the pivot point of the vibration and depending on the distance of the measurement point from the pivot point of the vibration.

The same applies to stage location measurements. There may be movements or misalignment of the stage with respect to the charged particle beam column, which may indicate a magnification factor of 1. This means, if the stage is misaligned by 20 nm, the charged particle beam is also misaligned by 20 nm. However, if, for example, the movement of the stage with respect to the column originates from a vibration of the column, a vibrational amplitude of the column in the range of about 10 nm may result in a movement of the beam on the specimen in the range of about 15 nm.

Thus, separating the measured variation of the location into different components may improve the transformation of the location signals to the correction signals.

Independent of specific embodiments, the following features may be provided independently or combined. The supporting member for further supporting the emitter may include a base and a support wire. Thereby, typically, the support wire may be a bent tungsten or tantalum hairpin wire. However, also other suitable materials may also be used. Further, the supporting member may include a stabilization element. The emitter location measuring device may be a contact-less measuring device. Typically, it may include a light source, such as a laser, and a detector. Yet, the detector may include at least two segments. For example, an array with 2×2 arrays, a 64×64 array or other segmented detectors may also be used. Additionally or optionally, the emitter location measuring device may include multi-fiber optics. Further, the emitter location measuring device may include an interferometer. As described above, the charged particle beam apparatus may further include a calibration amplifier for generating a correction signal provided to the deflector system, wherein the emitter correction signal is based on an emitter location signal of the emitter location measuring device.

According to yet other embodiments, the following features may be provided independently or combined. Methods may include the steps of generating an emitter location signal; transforming the emitter location signal to a first correction signal; and providing the first correction signal to a deflector system. Methods may additionally or alternatively include: generating a stage location signal; transforming the stage location signal to a second correction signal; and providing the second correction signal to a deflector system. According to yet another embodiment, the method may include generating an emitter location signal and a stage location signal; transforming the emitter location signal and the stage location signal to a first correction signal; and providing the first correction signal to a deflector system. Additionally, the transforming step may further include analyzing the emitter location signal and/or the stage location signal with respect to different frequencies included in the variations in locations of the emitter and/or the stage.

While the foregoing is directed to embodiments of the present invention, other and further embodiments of the invention may be devised without departing from the basic scope thereof, and the scope thereof is determined by the claims that follow.

The invention claimed is:

1. A charged particle beam apparatus comprising:
   a charged particle beam source comprising:
      an emitter having an emitter needle with an emitter tip; and
      a supporting member configured to support the emitter;
   an emitter location measuring device configured to repeatedly measure the location of the emitter using the emitter needle as a measuring point; and
   a deflector system configured to compensate for variations in the location of the emitter.

2. A charged particle beam apparatus comprising:
   a charged particle beam source comprising:
      an emitter with an emitter tip; and
      a supporting member configured to support the emitter, wherein the supporting member comprises a base and a support wire;
   an emitter location measuring device configured to repeatedly measure the location of the emitter using the support wire as a measuring point; and
   a deflector system configured to compensate for variations in the location of the emitter.

3. The charged particle beam apparatus according to claim 2, wherein the support wire is a bent hairpin wire.

4. The charged particle beam apparatus according to claim 1, wherein the supporting member comprises a stabilization element.

5. The charged particle beam apparatus according to claim 1, wherein the emitter location measuring device is adapted to measure variations in the location of the emitter along a first direction and comprises a first measuring assembly.

6. The charged particle beam apparatus according to claim 5, wherein the emitter location measuring device is adapted to measure variations in the location of the emitter along a second direction essentially perpendicular to the first direction and comprises a second measuring assembly.

7. The charged particle beam apparatus according to claim 1, wherein the emitter location measuring device is a contact-less measuring device.

8. The charged particle beam apparatus according to claim 1, wherein the emitter location measuring device comprises a light source and a detector.

9. The charged particle beam apparatus according to claim 8, wherein the light source is a laser.

10. The charged particle beam apparatus according to claim 8, wherein the detector comprises at least two segments.

11. The charged particle beam apparatus according to claim 1, wherein the emitter location measuring device comprises multi-fiber optics.

12. The charged particle beam apparatus according to claim 1, wherein the emitter location measuring device includes an interferometer.

13. The charged particle beam apparatus according to claim 1, wherein the deflector system is a post-lens deflector system.

14. The charged particle beam apparatus according to claim 1, further comprising a scan unit.

15. The charged particle beam apparatus according to claim 1, further comprising an emitter location calibration amplifier configured to generate an emitter correction signal provided to the deflector system, wherein the emitter correction signal is based on an emitter location signal of the emitter location measuring device.

16. The charged particle beam apparatus according to claim 1, further comprising a stage location measuring device.

17. The charged particle beam apparatus according to claim 16, wherein the stage location measuring device is an interferometer.

18. The charged particle beam apparatus according to claim 16, further comprising a stage location calibration amplifier configured to generate a stage location correction signal provided to the deflector system, wherein the stage location correction signal is based on a stage location signal of the stage location measuring device.

19. The charged particle beam apparatus according to claim 16, wherein a combined correction signal is provided to the deflector system and wherein the combined correction signal is based on a stage location signal of the stage location measuring device and an emitter location signal of the emitter location measuring device.

20. A charged particle beam apparatus comprising:
a charged particle beam source comprising:
an emitter having an emitter needle with an emitter tip; and
a supporting member configured to support the emitter;
an emitter location measuring device configured to repeatedly measure the location of the emitter using the emitter needle as a measuring point; and
a stage positioning system adapted to compensate for variations in the location of the emitter.

21. The charged particle beam apparatus according to claim 20, further comprising a deflector system for compensating variations in the location of the emitter.

22. The charged particle beam apparatus according to claim 21, further comprising dividing means for dividing a correction signal into a deflector system correction signal provided to the deflector system and a stage positioning correction signal provided to the stage positioning system.

23. The charged particle beam apparatus according to claim 20, wherein the supporting member comprises a base and a support wire.

24. The charged particle beam apparatus according to claim 23, wherein the support wire is a bent hairpin wire.

25. The charged particle beam apparatus according to claim 20, wherein the supporting member comprises a stabilization element.

26. The charged particle beam apparatus according to claim 20, wherein the emitter location measuring device is adapted to measure variations in the location of the emitter along a first direction and comprises a first measuring assembly.

27. The charged particle beam apparatus according to claim 26, wherein the emitter location measuring device is adapted to measure variations in the location of the emitter along a second direction essentially perpendicular to the first direction and comprises a second measuring assembly.

28. The charged particle beam apparatus according to claim 20, wherein the emitter location measuring device is a contact-less measuring device.

29. The charged particle beam apparatus according to claim 20, wherein the emitter location measuring device comprises a light source and a detector.

30. The charged particle beam apparatus according to claim 29, wherein the light source is a laser.

31. The charged particle beam apparatus according to claim 29, wherein the detector comprises at least two segments.

32. The charged particle beam apparatus according to claim 20, wherein the emitter location measuring device comprises multi-fiber optics.

33. The charged particle beam apparatus according to claim 20, wherein the emitter location measuring device includes an interferometer.

34. The charged particle beam apparatus according to claim 21 wherein the deflector system is a post-lens deflector system.

35. The charged particle beam apparatus according to claim 20, further comprising a scan unit.

36. The charged particle beam apparatus according to claim 21, further comprising an emitter location calibration amplifier configured to generate an emitter correction signal provided to the deflector system, wherein the emitter correction signal is based on an emitter location signal of the emitter location measuring device.

37. The charged particle beam apparatus according to claim 21, further comprising a stage location measuring device.

38. The charged particle beam apparatus according to claim 37, wherein the stage location measuring device is an interferometer.

39. The charged particle beam apparatus according to claim 37, further comprising a stage location calibration amplifier configured to generate a stage location correction signal provided to the deflector system, wherein the stage location correction signal is based on a stage location signal of the stage location measuring device.

40. The charged particle beam apparatus according to claim 37, wherein a combined correction signal is provided to the deflector system and wherein the combined correction signal is based on a stage location signal of the stage location measuring device and an emitter location signal of the emitter location measuring device.

41. A method of compensating variations in an emitter location of a charged particle beam apparatus including an emitter having an emitter needle with an emitter tip, comprising the steps of:
measuring the emitter location using the emitter needle as a measuring point; and
compensating for variations in the emitter location.

42. The method according to claim 41, further comprising:
measuring a stage location of a stage for supporting a specimen; and
compensating for variations in the stage location.

43. The method according to claim 41, wherein compensating for variations comprises deflecting a charged particle beam emitted by the charged particle beam emitter.

44. The method according to claim 42, wherein compensating for variations in the stage location comprises moving the stage.

45. The method according to claim 41, further comprising:
generating an emitter location signal;
transforming the emitter location signal to an emitter correction signal; and
providing the emitter correction signal to a deflector system.

46. The method according to claim 41, further comprising:
generating a stage location signal;
transforming the stage location signal to a stage correction signal; and
providing the stage correction signal to a deflector system.

47. The method according to claim 41, further comprising:
generating an emitter location signal and a stage location signal;
transforming the emitter location signal and the stage location signal to a first correction signal; and
providing the first correction signal to a deflector system.

48. The method according to claim 47, wherein transforming the emitter location signal and the stage location signal comprises analyzing the emitter location signal and/or the stage location signal with respect to different frequencies included in the variations in locations of the emitter and/or the stage.

49. The method according to claim 41, wherein the emitter is adapted for emitting ions.

50. The charged particle beam apparatus according to claim 2, wherein the emitter location measuring device is adapted to measure variations in the location of the emitter along a first direction and comprises a first measuring assembly.

51. The charged particle beam apparatus according to claim 50, wherein the emitter location measuring device is adapted to measure variations in the location of the emitter along a second direction essentially perpendicular to the first direction and comprises a second measuring assembly.

52. The charged particle beam apparatus according to claim 2, wherein the emitter location measuring device is a contact-less measuring device.

53. The charged particle beam apparatus according to claim 2, wherein the emitter location measuring device comprises a light source and a detector.

54. The charged particle beam apparatus according to claim 53, wherein the light source is a laser.

55. The charged particle beam apparatus according to claim 53, wherein the detector comprises at least two segments.

56. The charged particle beam apparatus according to claim 2, wherein the emitter location measuring device comprises multi-fiber optics.

57. The charged particle beam apparatus according to claim 2, wherein the emitter location measuring device includes an interferometer.

58. The charged particle beam apparatus according to claim 2, wherein the deflector system is a post-lens deflector system.

59. The charged particle beam apparatus according to claim 2, further comprising a scan unit.

60. The charged particle beam apparatus according to claim 2, further comprising an emitter location calibration amplifier configured to generate an emitter correction signal provided to the deflector system, wherein the emitter correction signal is based on an emitter location signal of the emitter location measuring device.

61. The charged particle beam apparatus according to claim 2, further comprising a stage location measuring device.

62. The charged particle beam apparatus according to claim 61, wherein the stage location measuring device is an interferometer.

63. The charged particle beam apparatus according to claim 61, further comprising a stage location calibration amplifier configured to generate a stage location correction signal provided to the deflector system, wherein the stage location correction signal is based on a stage location signal of the stage location measuring device.

64. The charged particle beam apparatus according to claim 61, wherein a combined correction signal is provided to the deflector system and wherein the combined correction signal is based on a stage location signal of the stage location measuring device and an emitter location signal of the emitter location measuring device.

65. The charged particle beam apparatus according to claim 2, wherein the charged particle beam source is adapted for emitting ions.

66. The charged particle beam apparatus according to claim 20, wherein the charged particle beam source is adapted for emitting ions.

67. A charged particle beam apparatus comprising:
a charged particle beam source comprising:
an emitter with an emitter tip; and
a supporting member configured to support the emitter, wherein the supporting member comprises a base and a support wire;
an emitter location measuring device configured to repeatedly measure the location of the emitter using the support wire as a measuring point; and
a stage positioning system adapted to compensate for variations in the location of the emitter.

68. The charged particle beam apparatus according to claim 67, further comprising a deflector system for compensating variations in the location of the emitter.

69. The charged particle beam apparatus according to claim 68, further comprising dividing means for dividing a correction signal into a deflector system correction signal provided to the deflector system and a stage positioning correction signal provided to the stage positioning system.

70. The charged particle beam apparatus according to claim 68, wherein the deflector system is a post-lens deflector system.

71. The charged particle beam apparatus according to claim 68, further comprising an emitter location calibration amplifier configured to generate an emitter correction signal provided to the deflector system, wherein the emitter correction signal is based on an emitter location signal of the emitter location measuring device.

72. The charged particle beam apparatus according to claim 68, further comprising a stage location measuring device.

73. The charged particle beam apparatus according to claim 72, wherein the stage location measuring device is an interferometer.

74. The charged particle beam apparatus according to claim 72, further comprising a stage location calibration amplifier configured to generate a stage location correction signal provided to the deflector system, wherein the stage location correction signal is based on a stage location signal of the stage location measuring device.

75. The charged particle beam apparatus according to claim 72, wherein a combined correction signal is provided to the deflector system and wherein the combined correction signal is based on a stage location signal of the stage location measuring device and an emitter location signal of the emitter location measuring device.

76. The charged particle beam apparatus according to claim 67, wherein the support wire is a bent hairpin wire.

77. The charged particle beam apparatus according to claim 67, wherein the emitter location measuring device is adapted to measure variations in the location of the emitter along a first direction and comprises a first measuring assembly.

78. The charged particle beam apparatus according to claim 77, wherein the emitter location measuring device is adapted to measure variations in the location of the emitter along a second direction essentially perpendicular to the first direction and comprises a second measuring assembly.

79. The charged particle beam apparatus according to claim 67, wherein the emitter location measuring device is a contact-less measuring device.

80. The charged particle beam apparatus according to claim 67, wherein the emitter location measuring device comprises a light source and a detector.

81. The charged particle beam apparatus according to claim 80, wherein the light source is a laser.

82. The charged particle beam apparatus according to claim 80, wherein the detector comprises at least two segments.

83. The charged particle beam apparatus according to claim 67, wherein the emitter location measuring device comprises multi-fiber optics.

84. The charged particle beam apparatus according to claim 67, wherein the emitter location measuring device comprises an interferometer.

85. The charged particle beam apparatus according to claim 67, further comprising a scan unit.

86. The charged particle beam apparatus according to claim 67, wherein the charged particle beam source is adapted for emitting ions.

87. A method of compensating variations in an emitter location of a charged particle beam apparatus comprising an emitter with an emitter tip and a supporting member for supporting the emitter, wherein the supporting member comprises a base and a support wire, the method comprising the steps of:
measuring the emitter location using the support wire as a measuring point; and
compensating for variations in the emitter location.

88. The method according to claim 87, further comprising:
measuring a stage location of a stage for supporting a specimen; and
compensating for variations in the stage location.

89. The method according to claim 88, wherein compensating for variations in the stage location comprises moving the stage.

90. The method according to claim 87, wherein compensating for variations comprises deflecting a charged particle beam emitted by the charged particle beam emitter.

91. The method according to claim 87, further comprising:
generating an emitter location signal;
transforming the emitter location signal to an emitter correction signal; and
providing the emitter correction signal to a deflector system.

92. The method according to claim 87, further comprising:
generating a stage location signal;
transforming the stage location signal to a stage correction signal; and
providing the stage correction signal to a deflector system.

93. The method according to claim 87, further comprising:
generating an emitter location signal and a stage location signal;
transforming the emitter location signal and the stage location signal to a first correction signal; and
providing the first correction signal to a deflector system.

94. The method according to claim 93, wherein transforming the emitter location signal and the stage location signal comprises analyzing the emitter location signal and/or the stage location signal with respect to different frequencies included in the variations in locations of the emitter and/or the stage.

95. The method according to claim 87, wherein the emitter is adapted for emitting ions.

* * * * *